(12) United States Patent
Kim

(10) Patent No.: US 12,424,466 B2
(45) Date of Patent: Sep. 23, 2025

(54) APPARATUS FOR TRANSFERRING DIE IN BONDING EQUIPMENT AND METHOD THEREOF

(71) Applicant: SEMES CO., LTD., Cheonan-si (KR)

(72) Inventor: Chang Jin Kim, Suwon-si (KR)

(73) Assignee: SEMES CO., LTD., Cheonan-si (KR)

( * ) Notice: Subject to any disclaimer, the term of this patent is extended or adjusted under 35 U.S.C. 154(b) by 984 days.

(21) Appl. No.: 17/517,432

(22) Filed: Nov. 2, 2021

(65) Prior Publication Data
US 2022/0139739 A1     May 5, 2022

(30) Foreign Application Priority Data
Nov. 4, 2020   (KR) .......................... 10-2020-0146202

(51) Int. Cl.
*H01L 21/67* (2006.01)
(52) U.S. Cl.
CPC .. *H01L 21/67132* (2013.01); *H01L 21/67144* (2013.01)
(58) Field of Classification Search
CPC ................... H01L 21/67132; H01L 21/67144
See application file for complete search history.

(56) References Cited

U.S. PATENT DOCUMENTS

| | | | |
|---|---|---|---|
| 6,890,304 B1 * | 5/2005 | Amano | A61B 5/4854 606/65 |
| 8,224,062 B2 * | 7/2012 | Ohkura | G01N 21/9501 382/149 |
| 8,680,876 B2 * | 3/2014 | Kadono | G06F 3/041 324/660 |
| 9,240,388 B2 | 1/2016 | Hirose | |
| 2010/0117483 A1 * | 5/2010 | Tanaka | H03H 9/02992 310/313 B |
| 2010/0186512 A1 * | 7/2010 | Goto | H01L 22/12 73/632 |

(Continued)

FOREIGN PATENT DOCUMENTS

| CN | 104900562 | 9/2015 |
|---|---|---|
| EP | 3709351 | 9/2020 |

(Continued)

OTHER PUBLICATIONS

Office Action from the Taiwan Intellectual Property Office dated Sep. 12, 2022.

(Continued)

*Primary Examiner* — Saul Rodriguez
*Assistant Examiner* — Ashley K Romano

(57) ABSTRACT

An apparatus for transferring dies in bonding equipment includes an ejector configured to push up a die attached to a dicing tape, an ejector controller controlling the ejector to move up or move down, a gas passage disposed in the ejector and forming a gas channel for applying vacuum pressure or pneumatic pressure, a gas stream controller controlling the vacuum pressure or the pneumatic pressure through the gas passage, a tape suction unit disposed outside the ejector and suctioning the dicing tape using vacuum pressure, a picker suctioning and transferring the die from above, and a picker controller moving-up and moving down the picker.

20 Claims, 13 Drawing Sheets

(56) References Cited

U.S. PATENT DOCUMENTS

2012/0262715 A1\* 10/2012 Sakai .................... G01N 21/21
356/369
2014/0027049 A1   1/2014 Joo et al.
2018/0142130 A1   5/2018 Hayashishita

FOREIGN PATENT DOCUMENTS

| | | |
|---|---|---|
| JP | 2014-011416 | 1/2014 |
| JP | 2014-027246 | 2/2014 |
| KR | 10-2016-0068201 | 6/2016 |
| KR | 10-2019-0012112 | 2/2019 |
| TW | 201608665 | 3/2016 |

OTHER PUBLICATIONS

Office Action from the Japan Patent Office dated Feb. 1, 2023.
Office Action from the Korean Intellectual Property Office dated Aug. 8, 2023.

\* cited by examiner

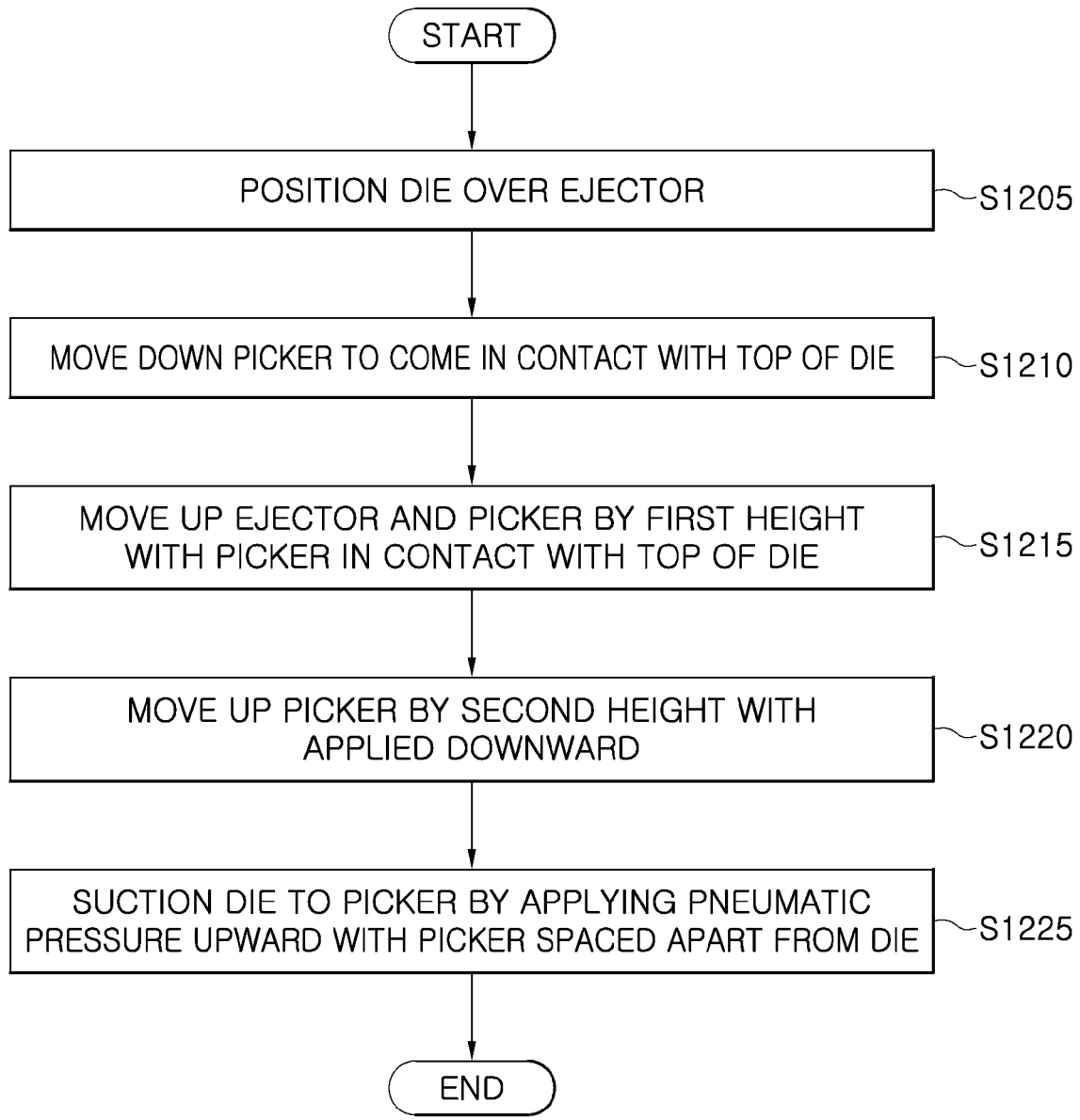

APPARATUS FOR TRANSFERRING DIE IN BONDING EQUIPMENT AND METHOD THEREOF

CROSS REFERENCE TO RELATED APPLICATION

The present application claims priority to Korean Patent Application No. 10-2020-0146202, filed Nov. 4, 2020, the entire contents of which is incorporated herein for all purposes by this reference.

BACKGROUND OF THE INVENTION

Field of the Invention

The present disclosure relates to an apparatus for transferring dies in bonding equipment and a method thereof and, more particularly, to an apparatus and method that can effectively transfer thin dies.

Description of the Related Art

A semiconductor manufacturing process is a process for manufacturing semiconductor devices on a wafer, and for example, includes exposing, depositing, etching, ion injecting, washing, etc. A process for bonding dies to a substrate (e.g., Printed Circuit Board (PCB)) for packaging may be performed on dies configured in the unit of chips through a semiconductor manufacturing process.

The dies are attached to a dicing tape, pushed up by an ejector, and then combined and transferred by a picker. As dies become very thin, plans for picking up dies while minimizing shock that is applied to the dies are being discussed.

SUMMARY OF THE INVENTION

Accordingly, an embodiment of the present disclosure provides an apparatus and method that can effectively transfer thin dies.

Objectives of the present disclosure are not limited to those described above and other objectives that are not stated herein can be clearly understood by those skilled in the art from the following description.

An apparatus for transferring dies in bonding equipment according to an embodiment of the present disclosure includes: an ejector configured to push up a die attached to a dicing tape; an ejector controller configured to control moving-up or moving down of the ejector; a gas passage disposed in the ejector and forming a gas channel for applying vacuum pressure; a gas stream controller configured to control the vacuum pressure to be applied through the gas passage; a tape suction unit disposed outside the ejector and configured to suction the dicing tape using vacuum pressure; a picker configured to suction and transfer the die from above; and a picker controller configured to control moving-up and moving down of the picker. The picker controller moves down the picker such that the picker contacts a top of the die, the ejector controller and the picker controller move up the ejector and the picker by a first height with the picker in contact with the top of the die, and the picker controller further moves up the picker by a second height with vacuum pressure applied downward by the gas stream controller.

In an embodiment, the gas passage may form a channel for applying pneumatic pressure to the die, and the gas stream controller may control the pneumatic pressure to be applied through the gas passage and may apply pneumatic pressure with the picker moved up by the second height to be spaced apart from the ejector.

In an embodiment, the gas stream controller may perform control such that vacuum pressure is applied downward while the picker is moved down.

In an embodiment, the gas stream controller may remove the vacuum pressure when the picker contacts the top of the die.

In an embodiment, the gas stream controller may perform control such that vacuum pressure is applied downward while the ejector and the picker are moved up by the first height.

In an embodiment, the ejector may include: a first ejector surrounding the gas passage; and a second ejector surrounding the first ejector.

In an embodiment, the ejector controller may individually control moving-up of the first ejector and the second ejector.

In an embodiment, the picker controller may control the picker to move up with an upper ejector of the first ejector and the second ejector while the picker is moved up in contact with the top of the die.

In an embodiment, the ejector controller may move up the first ejector and the second ejector by the first height, and may move down the second ejector to a middle point of the first height with the first ejector fixed.

In an embodiment, the ejector controller may move up the first ejector and the second ejector to a middle point of the first height, and may move up the first ejector with the second ejector fixed at the middle point.

In an embodiment, the first height and the second height may be set different from each other.

In an embodiment, the second height may be set smaller than the first height.

A method of transferring a die in bonding equipment of semiconductor dies according to an embodiment of the present disclosure includes: positioning a die attached to a dicing tape over a ejector; moving down a picker such that the picker contacts a top of the die; moving up the ejector and the picker by a first height with the picker in contact with the top of the die; further moving up the picker by a second height with vacuum pressure applied downward; and applying pneumatic pressure with the picker spaced apart from the ejector.

In an embodiment, the moving down of a picker may include applying vacuum pressure downward while the picker is moved down.

In an embodiment, the moving down of a picker may include removing the vacuum pressure when the picker contacts the top of the die.

In an embodiment, the ejector may include a first ejector surrounding a gas passage to which the vacuum pressure or pneumatic pressure is applied, and a second ejector surrounding the first ejector, and the moving up of the ejector and the picker by the first height may include controlling the picker to move up with an upper ejector of the first ejector and the second ejector.

In an embodiment, the moving up of the ejector and the picker by the first height may include: moving up the first ejector and the second ejector to a middle point of the first height; and moving up the first ejector with the second ejector fixed at the middle point.

In an embodiment, the moving up of the ejector and the picker by the first height may include: moving up the first ejector and the second ejector by the first height; and moving down the second ejector to a middle point of the first height with the first ejector fixed.

A bonding equipment for a semiconductor according to an embodiment of the present disclosure includes: a wafer stage configured to support a wafer including individual dies and to selectively separate the dies from the wafer; a die transfer unit configured to transfer the dies from the wafer stage; a die stage on which the dies transferred by the die transfer unit are seated and examined; a bonding unit configured to pick up the dies from the die stage and to bond the dies on substrates, respectively; and a bonding stage configured to support the substrates and to transmit substrates, which finished being bonded, to a magazine. The wafer stage includes: an ejector configured to push up the dies attached to a dicing tape; an ejector controller configured to control moving-up or moving down of the ejector; a gas passage disposed in the ejector and forming a gas channel for applying vacuum pressure or pneumatic pressure; a gas stream controller configured to control the vacuum pressure or the pneumatic pressure through the gas passage; and a tape suction unit disposed outside the ejector and configured to suction the dicing tape using vacuum pressure. The die transfer unit includes: a picker configured to suction and transfer the dies from above; and a picker controller configured to control moving-up and moving down of the picker. The picker controller moves down the picker such that the picker contacts a top of a die. The gas stream controller controls such that vacuum pressure is applied downward while the picker is moved down. The ejector controller moves up the ejector by a first height. The picker controller causes the vacuum pressure which is applied downward by the gas stream controller to move up the picker which is in contact with the top of the die by the first height. The picker controller further moves up the picker by a second height with the vacuum pressure applied downward by the gas stream controller. The gas stream controller applies pneumatic pressure upward with the picker spaced apart from the ejector so that the picker suctions the die.

According to an embodiment of the present disclosure, a die is detached from a dicing tape in the state in which the die is in contact with an ejector and a picker in the early stage, and then the die can be picked up in a non-contact type with the die and the picker spaced apart from each other, so the die can be picked up without being damaged.

Objectives of the present disclosure are not limited to those described above and other objectives that are not stated herein can be clearly understood by those skilled in the art from the following description.

BRIEF DESCRIPTION OF THE DRAWINGS

The above and other objectives, features and other advantages of the present invention will be more clearly understood from the following detailed description when taken in conjunction with the accompanying drawings, in which:

FIG. 12 is a flowchart for performing a method of transferring dies according to an embodiment of the present disclosure.

DETAILED DESCRIPTION OF THE INVENTION

Figure 1:
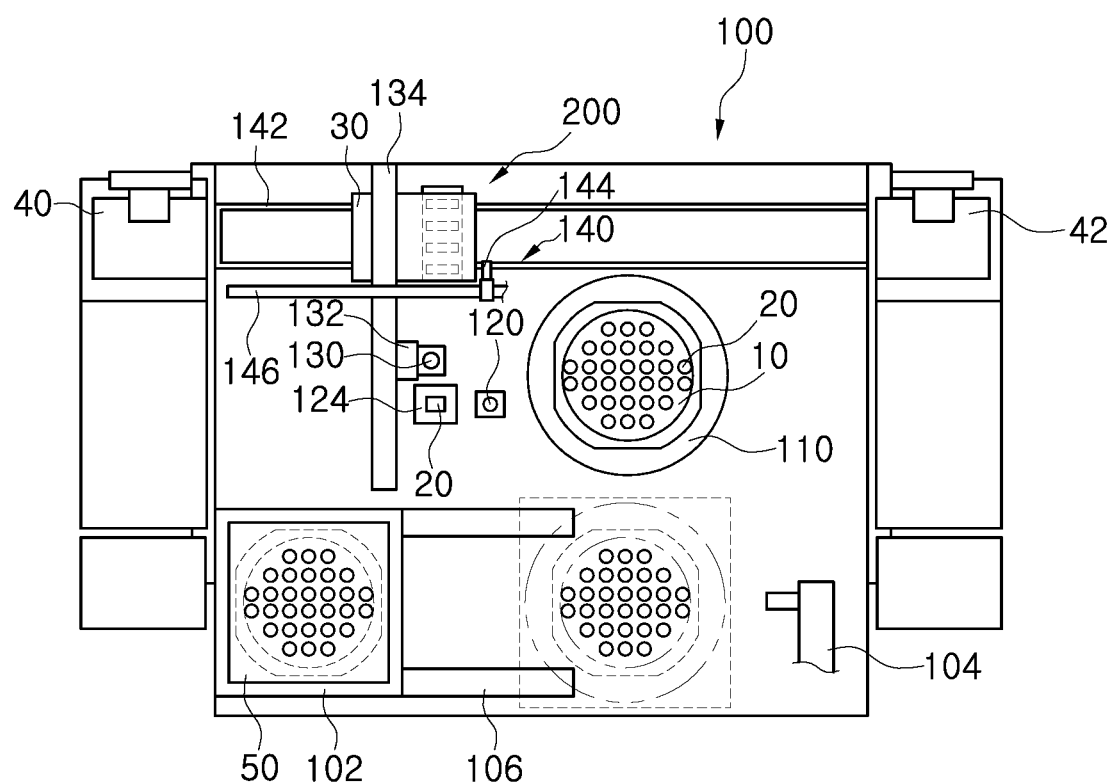
FIG. 1 is a view schematically showing the structure of bonding equipment according to an embodiment of the present disclosure.

Embodiments of the present disclosure will be described in detail with reference to the accompanying drawings so that those skilled in the art can easily accomplish the present disclosure. As those skilled in the art would realize, the described embodiments may be modified in various different ways, all without departing from the spirit or scope of the present invention.

In the accompanying drawings, portions unrelated to the description will be omitted in order to obviously describe the present invention, and similar reference numerals will be used to describe similar portions throughout the present specification.

In various embodiments, components having the same configuration are given the same reference numerals and described only in a representative embodiment, and only configurations different from the representative embodiment are described in other embodiments.

Throughout the specification, when an element is referred to as being "connected with (coupled to)" another element, it may be "directly connected (coupled)" to the other element and may also be "indirectly connected (coupled)" to the other element with another element intervening therebetween. Further, unless explicitly described otherwise, "comprising" any components will be understood to imply the inclusion of other components rather than the exclusion of any other components.

Unless defined otherwise, it is to be understood that all the terms used in the specification including technical and scientific terms has the same meaning as those that are understood by those who skilled in the art. It will be further understood that terms such as terms defined in common dictionaries should be interpreted as having a meaning that is consistent with their meaning in the context of this specification and the relevant art and will not be interpreted in an idealized or overly formal sense unless expressly so defined herein.

Figure 2:
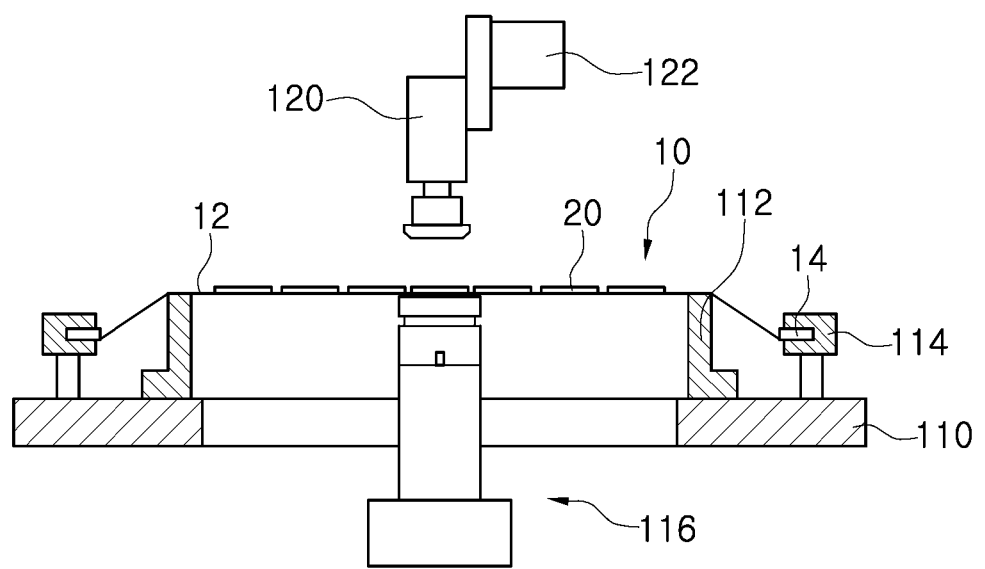
FIG. 2 is a view schematically showing the structure of an apparatus for transferring dies in the bonding equipment according to an embodiment of the present disclosure.

FIG. 1 is a view schematically showing the structure of bonding equipment 100 according to an embodiment of the present disclosure and FIG. 2 is a view schematically showing the structure of an apparatus for transferring dies 20 in the bonding equipment 100 according to an embodiment of the present disclosure. The bonding equipment 100 may be used to bond dies 20 on a substrate (e.g., a PCB or a lead frame) in a die bonding process for manufacturing a semiconductor package.

The bonding equipment 100 according to an embodiment of the present disclosure includes: a wafer stage 110 that supports a wafer 10 including individual dies 20 and selectively separates the dies 20; a die transfer unit 120 that transfers the dies 20 from the wafer stage 110; a die stage 124 on which the dies 20 transferred by the die transfer unit 120 are seated and examined; a bonding unit 130 that picks up the dies 20 from the die stage 124 and bonds the dies 20 on substrates 30, respectively; and a bonding stage 200 that supports the substrates 30 and transmits substrates 30 that finished being bonded to a second magazine 42.

The bonding equipment 100 can pick up dies 20 from the wafer 10 including dies 20 individualized through dicing and can bond the dies 20 to substrates 30, respectively. The wafer 10 may be provide in the state in which the wafer 10 is attached to a dicing tape 12 and the dicing tape 12 may be mounted on a substantially circular ring-shaped mount frame 14. A cassette 50 having a plurality of wafers 10 therein is fed from a load port 102. The wafer transfer unit 104 takes out a wafer 10 from the cassette 50 and loads the wafer 10 onto the wafer stage 110. The wafer transfer unit 104 can move along guide rails 106 installed between the cassette 50 and the wafer stage 110.

A circular ring-shaped expansion ring 112 may be disposed on the wafer stage 110 and the expansion ring 112 can support the edge of the dicing tape 12. Clamps 114 for holding the mount frame 14 and a clamp actuator (not shown) expanding the dicing tape 12 by moving down the clamps 114 with the dicing tape 12 supported by the expansion ring 112 may be disposed on the wafer stage 110.

Figure 3:
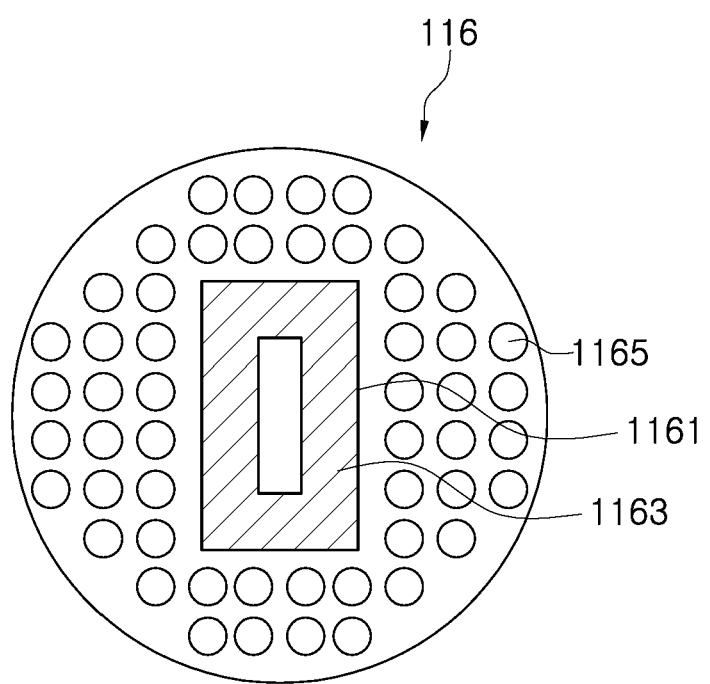
FIG. 3 is a cross-sectional view of an ejector according to an embodiment of the present disclosure.
Figure 4A:
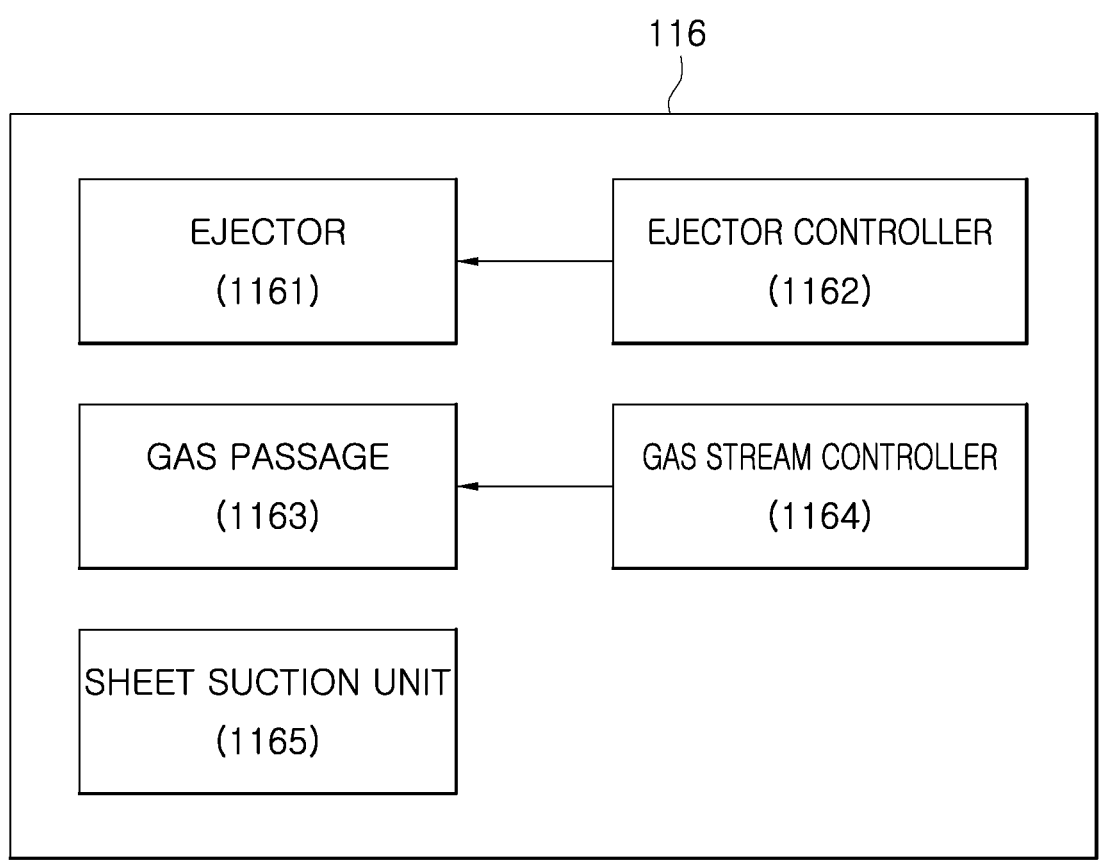
FIGS. 4A and 4B are block diagrams of an apparatus for transferring dies according to an embodiment of the present disclosure.

An ejecting unit 116 for selectively separating the dies 20 may be disposed under the wafer 10 supported on the wafer stage 110. According to an embodiment of the present disclosure, as shown in FIGS. 3 and 4A, the ejecting unit 116 includes: an ejector 1161 that pushes a die 20 attached to the dicing tape 12; an ejector controller 1162 that controls ascending or descending of the ejector 1161; a gas passage 1163 disposed inside the ejector 1161 and forming a gas channel for applying vacuum; a gas stream controller 1164 that performs control such that vacuum pressure is applied through the gas passage 1163; and tape suction units 1165 that are disposed outside the ejector 1161 and suctions the dicing tape 12. Further, the gas passage 1163 may form a channel for applying pneumatic pressure to a die 20 and the gas stream controller 1164 may perform control such that pneumatic pressure is applied through the gas passage 1163.

Referring to FIG. 3, the gas passage 1163 is positioned at the center of the ejecting unit 116 and suctions or discharges gas, whereby vacuum pressure or pneumatic pressure can be applied to the dicing tape 12 and a die 20. Though not shown, the gas passage may be connected to a suction pipe for suctioning gas and a discharge pipe for discharging gas. A suction valve that controls the gas flow in the suction pipe and a discharge valve that controls the gas flow in the discharge pipe may be provided, and a suction switch that controls the suction valve and a discharge switch that controls the discharge valve may be provided. The gas stream controller 1164 can control on/off of the suction switch or the discharge switch such that gas is suctioned through the gas passage 1163 and accordingly vacuum pressure is applied or such that gas is discharged and accordingly pneumatic pressure is applied.

The ejector 1161 is disposed around the gas passage 1163 to move up a die 20 by ascending and descending. The ejector 1161 may be a body having predetermined strength and can be moved up or down by an actuator (not shown) such as a linear motor. The ejector controller 1162 controls the actuator for moving up or down the ejector 1161, thereby being able to move up or down the ejector.

Figure 4B:
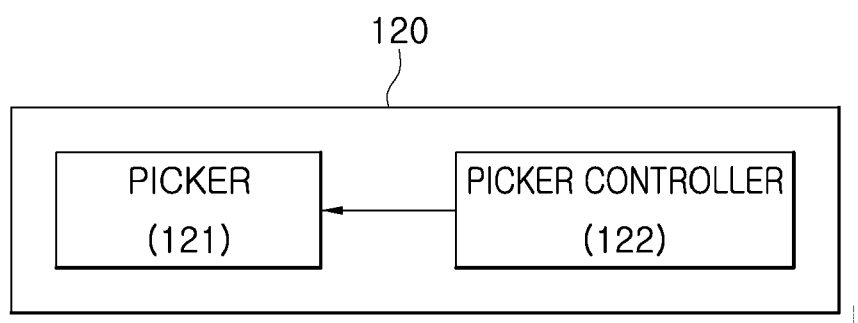

As shown in FIGS. 3 and 4B, the die transfer unit 120 includes a picker 121 that suctions and transfers a die 20 from above, and a picker controller 122 that controls ascending and descending the picker 121. The picker 121 may have a hole, which is formed in the outer portion to apply vacuum pressure, to pick up a die 20. Predetermined vacuum pressure is applied to the outer portion of the picker 121 and a die 20 can be suctioned to the picker 121 by the vacuum pressure. The picker 121 may be moved up and down by a lifter and is horizontally moved by a separate actuator, thereby being able to transfer a die 20. Since the picker controller 122 for controlling ascending and descending of the picker 121 is provided, it is possible to control the ascending and descending heights of the picker 121.

Though not shown, the wafer stage 110 may be configured to be able to be horizontally moved by a stage actuator and the wafer stage actuator can move the wafer stage 110 to a wafer load/unload region (the region indicated by a dotted line in FIG. 1) adjacent to the ends of the guide rails 106 to load and unload the wafer 10. The stage actuator can move the wafer stage 110 to selectively pick up the dies 20. That is, the stage actuator can adjust the position of the wafer stage 110 such that a die 20 to be picked up of the dies 20 is positioned over the ejecting unit 116.

The die 20 separated by the ejecting unit 116 can be picked up by the die transfer unit 120 disposed over the wafer stage 110. The die transfer unit 120 can transfer the die 20 over the die stage 124 disposed at a side of the wafer stage 110 after picking up the die 20 and the bonding unit 130 can pick up the die 20 on the die stage 124 and then can bond the die 20 to a substrate 30. To this end, the picker 121 may be configured to be able to move vertically and horizontally.

The substrate 30 can be taken out of the first magazine 40 and then transferred to the bonding stage 200, and can be transferred and kept in the second magazine 42 after bonding is finished. The bonding equipment 100 may include a substrate transfer unit 140 that transfers substrate 30 onto the bonding stage 200. For example, the substrate transfer unit 140 may include: guide rails 142 configured to guide substrates 30 among the first magazine 40, the bonding stage 200, and the second magazine 42; a gripper 144 configured to hold an end of substrates 30; and a gripper actuator 146 configured to move the gripper 144 horizontally (in the X-axial direction). After an end of a substrate 30 is held by the gripper 144, the gripper actuator 146 can move the gripper 144 and load the substrate 30 onto the bonding stage 200. Though not shown, the substrate transfer unit 140 may further include a second gripper (not shown) configured to move substrates 30 to the second magazine 42 after bonding is finished.

The bonding equipment 100 may include a first head actuator 132 that vertically moves the bonding unit 130 to pick up the die 20 on the die stage 124 and bond the die 20 to a substrate 30, and a second head actuator 134 that moves the bonding unit 130 in a second horizontal direction (e.g., the Y-axial direction) perpendicular to a horizontal direction between the die stage 124 and the bonding stage 200. Though not shown in detail, the bonding unit 130 may include a bonding tool configured to pick up dies 20 using vacuum pressure, and a heater configured to heat dies 20. That is, the bonding unit 130 can pick up dies 20 on the die stage 124 and bond the dies 20 to substrates 30. The bonding unit 130 may pick up dies 20 from the wafer 10 and directly bond the dies 20 to substrates 30.

A camera configured to take pictures of a fiducial mark on substrates 30 and a region where a die 20 is bonded in order to adjust the position of the substrates 30, that is, align the substrates 30 may be disposed over the bonding stage 200. Though not shown, the bonding equipment 100 may include several cameras to detect the dies 20 on the wafer 10, detect the die 20 on the die stage 124, and detect the die 20 picked up by the bonding unit 130.

An apparatus and method for picking up dies according to an embodiment of the present disclosure is described hereafter. As electronic devices are decreased in size, wafers 10 and dies 20 are also thinned. When a die 20 is thin, there is a possibility of damage to the die 20 when the die 20 is pushed up by the ejector 1161 and suctioned by the picker 121.

Accordingly, a method of picking up a die 20 in a non-contact type by pushing up a die 20 through the ejector 1161 and then pushing up the die 20 using the pneumatic pressure supplied through the gas passage 1163 with the picker 121 not in contact with and spaced a predetermined distance apart from the die 20 may be used.

Figure 5:
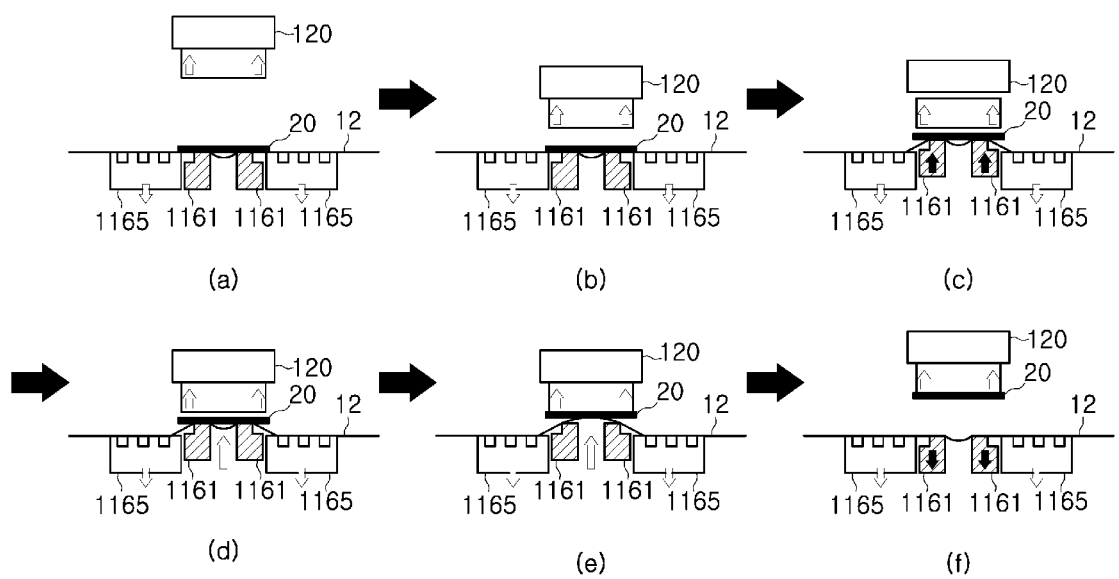
FIG. 5 shows an example of a process for transferring a die according to an embodiment of the present disclosure.

Referring to FIG. 5, first, the ejector 1161 moves up to come in close contact with the bottom of a die 20 from the initial position and then the picker 121 is positioned over the die 20 to pick up the die 20 (step (a) of FIG. 5). Thereafter, the picker 121 is stopped at a predetermine distance from the die 20 (step (b) of FIG. 5), and then the ejector 161 is moved up to a predetermined height, thereby pushing up and primarily detaching the die 20 from the wafer (step (c) of FIG. 5). Since there is a predetermined gap between the die 20 and the picker 121, they are not in contact with each other, and in this state, the dicing tape 12 is brought in close contact with the ejector 1161 by applying vacuum pressure downward, whereby the die 20 is secondarily detached from the dicing tape 12 (step (d) of FIG. 5). Thereafter, pneumatic pressure is applied upward, whereby the die 20 is completely detached from the dicing tape 12 and suctioned to the picker 121 (step (e) of FIG. 5). Thereafter, the picker 121 is moved up to transfer the die 20 and the ejector 1161 can be moved down to the initial position (step (f) of FIG. 5).

When the die 20 is thinner (under 30 μm) and the thin die 20 is warped, the die 20 may not be detached from the dicing tape 12, so it may be failed to pick up the die 20. For example, when a die 20 is very thin, it is too light, and when the die 20 is warped, the dicing tape 12 is not brought in completely close contact with the ejector 1161 due to coming-off of the die 20 even though vacuum pressure is applied down, so the die 20 may not be detached.

Accordingly, an embodiment of the present disclosure provides an apparatus and method that can successfully pick up dies 20 while suppressing damage to the dies 20. According to an embodiment of the present disclosure, in the early stage, the picker 121 is moved down and then the picker 121 and the ejector 1161 are both moved up with the picker 121 in contact with a die 20, whereby the die 20 is detached from the dicing tape 12. Thereafter, the picker 121 is moved up such that the die 20 is picked up by the picker 121 using the pressure of gas in a non-contact state from the die 20. Hereafter, an apparatus and method for picking up dies according to an embodiment of the present disclosure is described hereafter.

Figure 6:
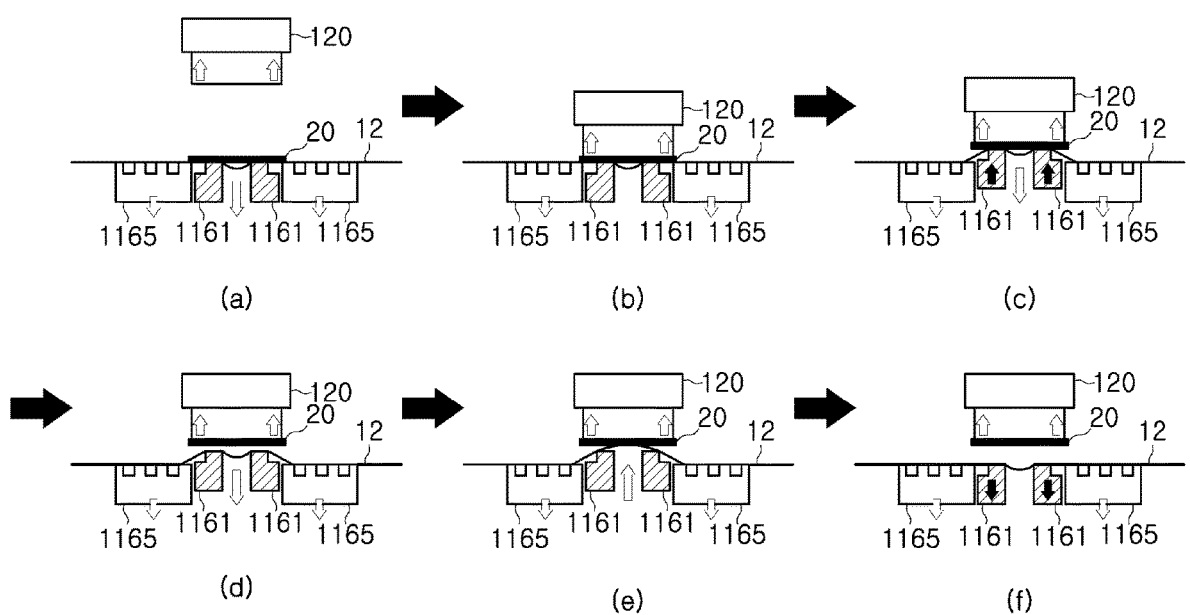
FIGS. 6 and 7 show a process for transferring a die according to an embodiment of the present disclosure.
Figure 7:
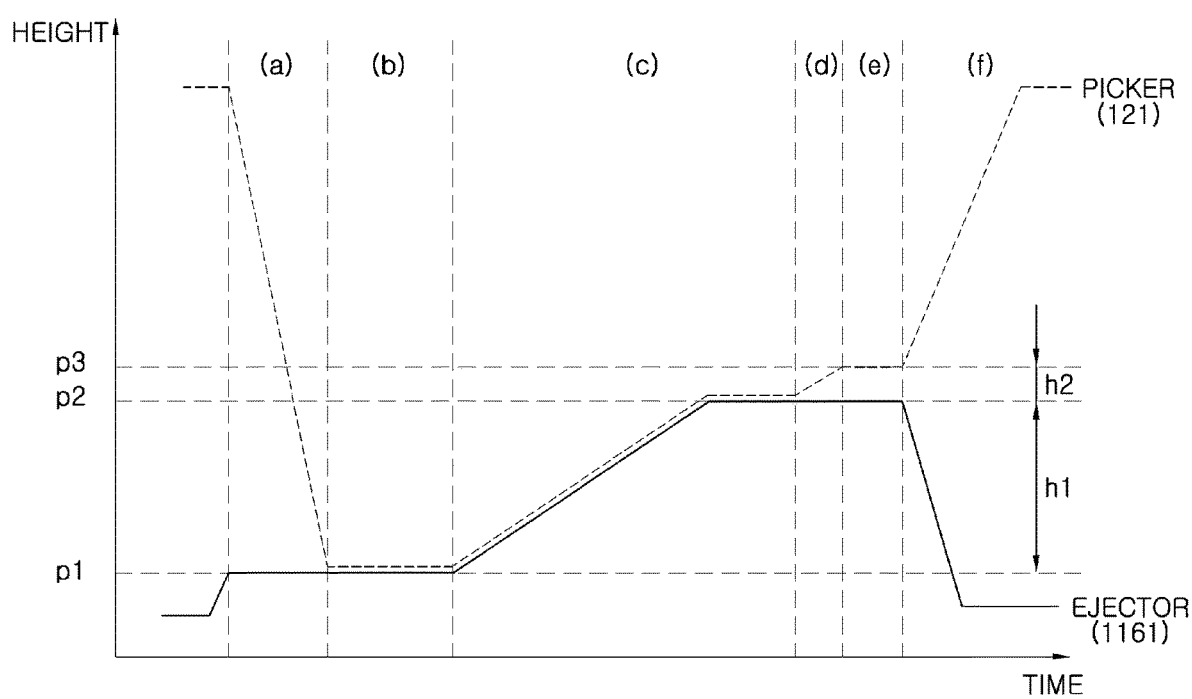

FIGS. 6 and 7 show a process for picking up a die 20 according to an embodiment of the present disclosure. FIG. 6 shows the positions of the ejector 1161 and the picker 121 and the flow direction of gas when a die 20 is picked up, and FIG. 7 shows the heights of the ejector 1161 and the picker 121 in each step shown in FIG. 6.

According to an embodiment of the present disclosure, the picker controller 122 moves down the picker 121 such that the picker 121 comes in contact with a die 20. Referring to the step (a) in FIGS. 6 and 7, the picker 121 is moved down to pick up a die 20. Simultaneously, the ejector 1161 can come in close contact with the bottom of the die 20 by moving up from the initial position. The gas stream controller 1164 performs control such that vacuum pressure is applied downward while the picker 121 is moved down. Since the vacuum pressure is applied downward, the warped die 20 is flattened, so it is possible to prevent failure of picking-up due to warp of the die 20.

Referring to the step (b) in FIGS. 6 and 7, the picker 121 comes in contact with the top of the die 20 and stops in contact with the die 20. The gas stream controller 1164 can perform control such that the vacuum pressure is removed when the picker 121 comes in contact with the top of the die 20.

Thereafter, as shown in the step (c) of FIGS. 6 and 7, the ejector controller 162 and the picker controller 122 move up the ejector 161 and the picker 121 by a first height h1 with the picker 121 in contact with the top of the die 20. The gas stream controller 1164 can perform control such that vacuum pressure is applied downward while the ejector 1161 and the picker 121 are moved up by the first height h1. Since the die 20 is moved up in contact with the picker 121, the die 20 can be primarily detached from the dicing tape 12. Further, since the die 20 is moved up in a flat state, the die 20 can be effectively detached without the dicing tape 12 coming off.

In an embodiment, the first height h1 and a second height h2 may be set different from each other. The second height h2 may be set smaller than the first height h1. The second height h2 is a height for suctioning the die 20 to the picker 121 by expanding upward the dicing tape 12 using pneumatic pressure, so the die 20 can be easily suctioned when the second height h2 should be set smaller than the first height h1. However, since the first and second heights h1 and h2 may be changed by a user, the second height h2 may be set larger than the first height h1, depending on embodiments.

Thereafter, as shown in the step (d) of FIGS. 6 and 7, the picker controller 122 moves up the picker 121 by the second height h2 with vacuum pressure applied downward by the gas stream controller 1164. That is, the picker 121 is spaced a predetermined distance apart from the ejector 1161. When the die 20 is moved up and completely detached from the dicing tape 12, the die 20 will be suctioned to the picker 121.

However, depending on cases, the die 20 may not be completely detached from the dicing tape 12, so a method that is the same as a non-contact type may be additionally used. As shown in the step (e) of FIGS. 6 and 7, the gas stream controller 1164 applies pneumatic pressure upward with the picker 121 spaced apart from the ejector 1161, whereby the die 20 is suctioned to the picker 121. Accordingly, the die 20 can be completely separated from the dicing tape 12 and suctioned to the picker 121. Thereafter, as shown in the step (f) of FIGS. 6 and 7, the picker 121 moves up and transfers the die 20 and the ejector 1161 can be returned down to the initial position.

Figure 8:
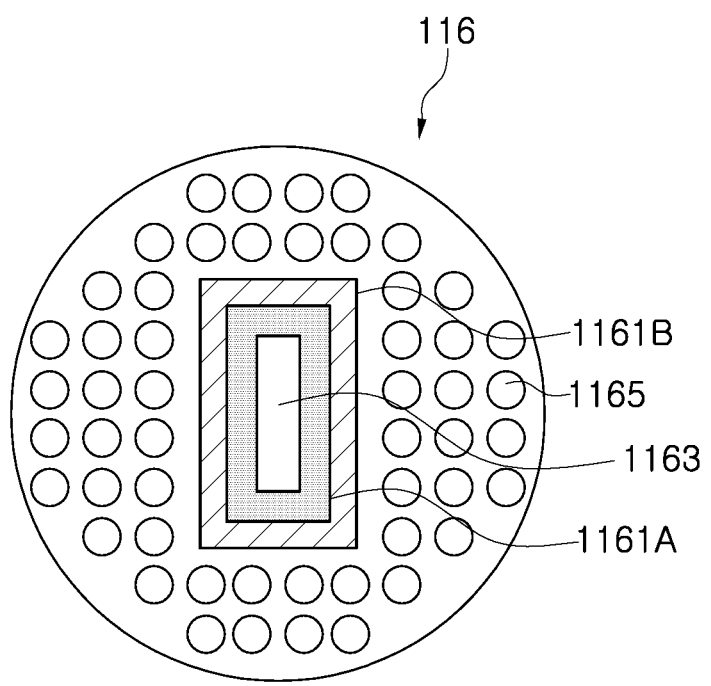
FIG. 8 is a cross-sectional view of an ejector according to another embodiment of the present disclosure.

According to another embodiment of the present disclosure, the ejector 1161 may be composed of several unit ejectors. That is, the ejector 1161 may be configured in a multi-stage type. For example, as shown in FIG. 8, the ejector 1161 may include a first ejector 1161A surrounding the gas passage 1163 and a second ejector 1161B surrounding the first ejector 1161A.

The ejector controller 1162 can individually control moving-up/down of the first ejector 1161A and the second ejector 1161B, so the ejector 1161 can be operated in multiple stages in terms of time and space. Even though the ejector 1161 is a single unit ejector, the ejector 1161 can be operated in multiple stages in terms of time.

In this case, the picker controller 122 can control the picker 121 such that the picker moves up with the upper one of the first ejector 1161A and the second ejector 1161B while the picker 121 is moved up in contact with the top of a die 20.

Figure 9:
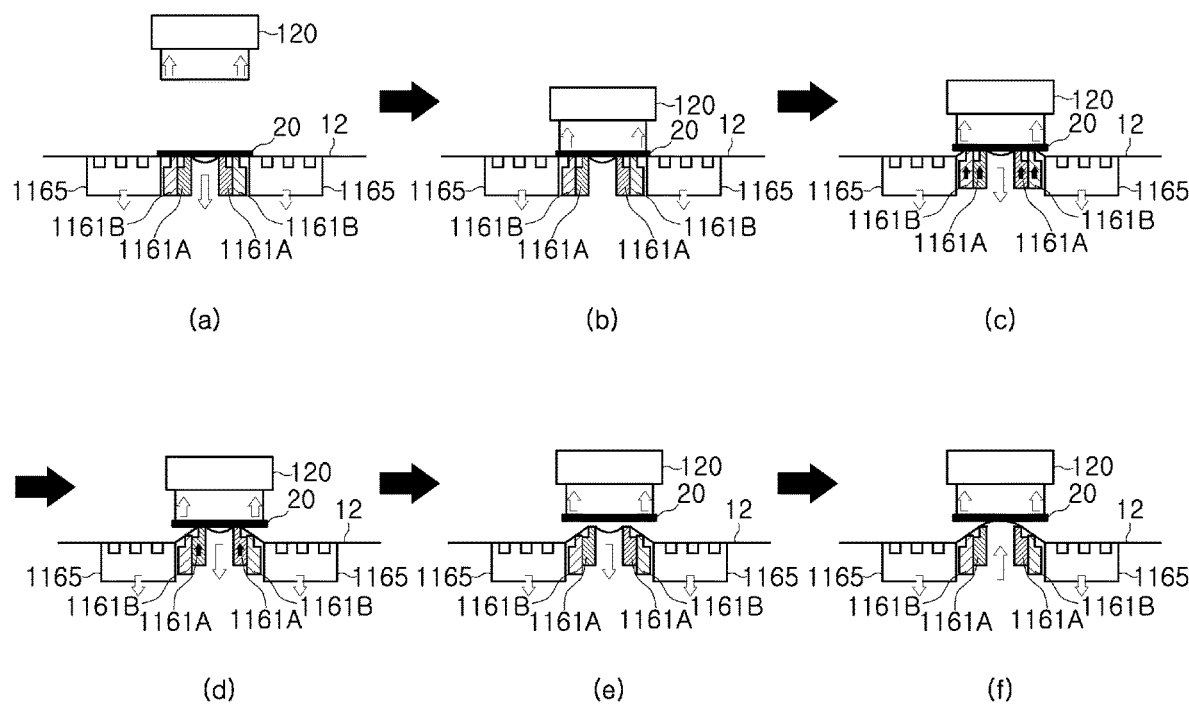
FIGS. 9 and 10 show a process for transferring a die according to another embodiment of the present disclosure.
Figure 10:
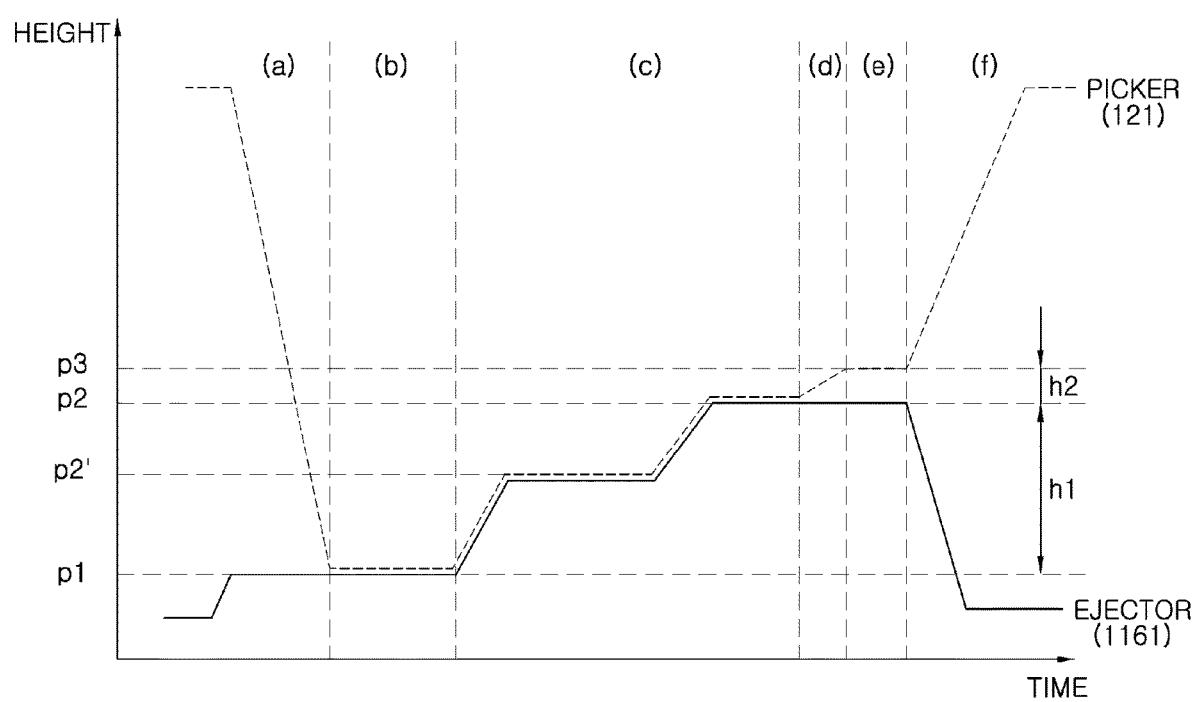

FIGS. 9 and 10 show a process for picking up a die 20 according to another embodiment of the present disclosure. FIG. 9 shows the positions of the ejector 1161 and the picker 121 and the flow direction of gas when a die 20 is picked up, and FIG. 10 shows the heights of the ejector 1161 and the picker 121 in each step shown in FIG. 9.

According to an embodiment of the present disclosure, the picker controller 122 moves down the picker 121 such that the picker 121 comes in contact with a die 20. Referring to the step (a) of FIGS. 9 and 10, the picker 121 is moved down to pick up a die 20. Simultaneously, the first ejector 1161A and the second ejector 1161B are moved up together from the initial position, thereby being able to come in contact with the bottom of the die 20. The gas stream controller 1164 performs control such that vacuum pressure is applied downward while the picker 121 is moved down. Since the vacuum pressure is applied downward, the warped die 20 is flattened, so it is possible to prevent failure of picking-up due to warp of the die 20.

Referring to the step (b) of FIGS. 9 and 10, the picker 121 comes in contact with the top of the die 20 and stops in contact with the die 20. The gas stream controller 1164 can perform control such that the vacuum pressure is removed when the picker 121 comes in contact with the top of the die 20.

Thereafter, as shown in the step (c) of FIGS. 9 and 10, the ejector controller 162 and the picker controller 122 move up the first ejector 1161A, the second ejector 1161B, and the picker 121 to the middle point of a first height h1 with the picker 121 in contact with the top of the die 20. The gas stream controller 1164 can perform control such that vacuum pressure is applied downward while the first ejector 1161A, the second ejector 1161B, and the picker 121 are moved up to the middle point of the first height h1.

As shown in the step (c) of FIGS. 9 and 10, the first ejector 1161A can be moved up with the second ejector 1161B fixed at the middle point. Similarly, the gas stream controller 1164 can perform control such that vacuum pressure is applied downward while the first ejector 1161A and the picker 121 are moved up.

According to this embodiment, the first ejector 1161A and the second ejector 1161B may be moved up step by step, whereby a die 20 can be sequentially detached from the dicing tape 12 from the outer side and thus the die 20 can be more effectively detached.

Thereafter, as shown in the step (d) of FIGS. 9 and 10, the picker controller 122 moves up the picker 121 by a second height h2 with vacuum pressure applied downward by the gas stream controller 1164. That is, the picker 121 is spaced a predetermined distance apart from the first ejector 1161A. When the picker 121 is moved up and the die 20 is completely detached from the dicing tape 12, the die 20 will be suctioned to the picker 121.

Similarly, as shown in the step (e) of FIGS. 9 and 10, the gas stream controller 1164 applies pneumatic pressure upward with the picker 121 spaced apart from the ejector 1161, whereby the die 20 is suctioned to the picker 121. Accordingly, the die can be completely separated from the dicing tape 12 and suctioned to the picker 121. Thereafter, the picker 121 moves up and transfers the die 20 and the ejector 1161 can be returned down to the initial position.

According to another embodiment of the present disclosure, it is possible to sequentially detach a die 20 from the dicing tape 12 from the outer side by moving down the second ejector 1161B positioned outside further than the first ejector 1161A after moving up both of the first ejector 1161A and the second ejector 1161B by the first height h1.

Figure 11:
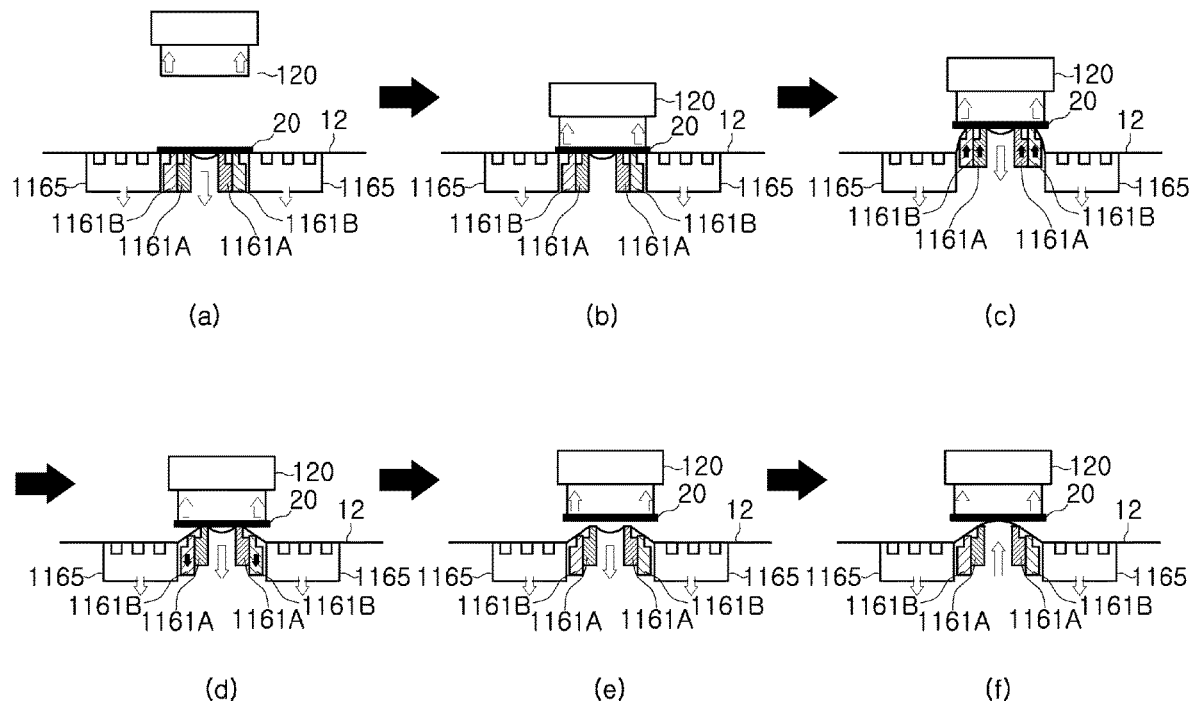
FIG. 11 shows a process for transferring a die according to another embodiment of the present disclosure.

FIG. 11 shows a process for picking up a die 20 according to another embodiment of the present disclosure.

According to an embodiment of the present disclosure, the picker controller 122 moves down the picker 121 such that the picker 121 comes in contact with a die 20. Referring to the step (a) of FIG. 11, the picker 121 is moved down to pick up a die 20. Simultaneously, the first ejector 1161A and the second ejector 1161B are moved up together from the initial position, thereby being able to come in contact with the bottom of the die 20. The gas stream controller 1164 performs control such that vacuum pressure is applied downward while the picker 121 is moved down. Since the vacuum pressure is applied downward, the warped die 20 is flattened, so it is possible to prevent failure of picking-up due to warp of the die 20.

Referring to the step (b) of FIG. 11, the picker 121 comes in contact with the top of the die 20 and stops in contact with the die 20. The gas stream controller 1164 can perform control such that the vacuum pressure is removed when the picker 121 comes in contact with the top of the die 20.

Thereafter, as shown in the step (c) of FIG. 11, the ejector controller 162 and the picker controller 122 move up the first ejector 1161A, the second ejector 1161B, and the picker 121 by a first height h1 with the picker 121 in contact with the top of the die 20. The gas stream controller 1164 can perform control such that vacuum pressure is applied downward while the first ejector 1161A, the second ejector 1161B, and the picker 121 are moved up by the first height h1.

As shown in the step (c) of FIG. 11, the second ejector 1161B can be moved down to the middle portion of the first height h1 with the first ejector 1161A fixed. Similarly, the gas stream controller 1164 can perform control such that vacuum pressure is applied downward while the second ejector 1161B is moved down.

According to this embodiment, the first ejector 1161A and the second ejector 1161B are both moved up and then the second ejector 1161B is moved down, whereby a die 20 can be sequentially detached from the dicing tape 12 from the outer side and thus the die 20 can be more effectively detached.

Thereafter, as shown the step (d) of FIG. 11, the picker controller 122 moves up the picker 121 by the second height h2 with vacuum pressure applied downward by the gas stream controller 1164. That is, the picker 121 is spaced a predetermined distance apart from the first ejector 1161A. When the picker 121 is moved up and the die 20 is completely detached from the dicing tape 12, the die 20 will be suctioned to the picker 121.

Similarly, the gas stream controller 1164 applies pneumatic pressure upward with the picker 121 spaced apart from the first ejector 1161A, whereby the die 20 is suctioned to the picker 121. Accordingly, the die 20 can be completely separated from the dicing tape 12 and suctioned to the picker 121. Thereafter, the picker 121 moves up and transfers the die 20 and the ejector 1161 can be returned down to the initial position.

FIG. 12 is a flowchart for performing a method of transferring dies 20 according to an embodiment of the present disclosure. Each operation shown in FIG. 12 may be controlled by each controller or processor and may be performed by each module of the bonding equipment 100.

A method of transferring dies according to an embodiment of the present disclosure includes: positioning a die 20 attached to a dicing tape 12 over an ejector 1161 (S1205); moving down a picker 121 such that the picker 121 comes in contact with the top of the die 20 (S1210); moving up the ejector 1161 and the picker 121 by a first height h1 with the picker 121 in contact with the top of the die 20 (S1215); moving up the picker 121 by a second height h2 with vacuum pressure applied downward (S1220); and suctioning the die 20 to the picker 121 by applying pneumatic pressure upward with the picker 121 spaced apart from the ejector 1161 (S1225).

In an embodiment, the moving down of a picker 121 (S1210) may include applying vacuum pressure downward while the picker 121 is moved down.

In an embodiment, the moving down of a picker 121 may include removing the vacuum pressure when the picker 121 comes in contact with the top of the die 20.

In an embodiment, the moving up of the ejector 1161 and the picker 121 (S1215) may include applying vacuum pressure downward while the ejector 1161 and the picker 121 are moved up by the first height h1.

In an embodiment, the ejector 1161 may include a first ejector 1161A surrounding a gas passage 1163 to which vacuum pressure or pneumatic pressure is applied, and a second ejector 1161B surrounding the first ejector 1161A. The moving up of the ejector 1161 and the picker 121 by a first height h1 (S1215) may include controlling the picker 121 such that the picker 121 moves up with the upper one of the first ejector 1161A and the second ejector 1161B.

The moving up of the ejector 1161 and the picker 121 (S1215) may include moving up the first ejector 1161A and the second ejector 1161B to the middle portion of the first height h1, and moving up the first ejector 1161A with the second ejector 1161B fixed at the middle point.

The moving up of the ejector 1161 and the picker 121 (S1215) may include moving up the first ejector 1161A and the second ejector 1161B by the first height h1, and moving up the second ejector 1161B to the middle point of the first height h1 with the first ejector 1161A fixed.

The embodiments and accompanying drawings only clearly show some of the spirit included in the present disclosure, and it would be apparent that modifications and detailed embodiments that can be easily inferred by those skilled in the art within the spirit included in the specification and drawings are included in the scope of the present disclosure.

Therefore, the spirit of the present disclosure should not be limited to the above-described embodiments, and the following claims as well as all modified equally or equivalently to the claims are intended to fall within the scope and spirit of the disclosure.

What is claimed is:

1. An apparatus for transferring dies in bonding equipment, the apparatus comprising:
an ejector configured to push up a die attached to a dicing tape;
an ejector controller configured to control moving-up or moving down of the ejector;
a gas passage disposed in the ejector and forming a gas channel for applying vacuum pressure;
a gas stream controller configured to control the vacuum pressure to be applied through the gas passage;
a tape suction unit disposed outside the ejector and configured to suction the dicing tape using vacuum pressure;
a picker configured to suction and transfer the die from above; and
a picker controller configured to control the picker to move up or move down,
wherein the picker controller moves down the picker such that the picker contacts a top of the die,
wherein the picker controller and the ejector controller move up the picker which is in contact with the top of the die and the ejector, respectively, by a first height at the same time, and
wherein the picker controller further moves up the picker by a second height with vacuum pressure applied downward by the gas stream controller.

2. The apparatus of claim 1, wherein the gas stream controller performs control such that vacuum pressure is applied downward while the picker is moved down.

3. The apparatus of claim 1, wherein the gas passage forms a channel for applying pneumatic pressure to the die, and
the gas stream controller controls the pneumatic pressure to be applied through the gas passage and applies pneumatic pressure with the picker moved up by the second height to be spaced apart from the ejector.

4. The apparatus of claim 1, wherein the gas stream controller performs control such that vacuum pressure is applied downward while the ejector and the picker are moved up by the first height.

5. The apparatus of claim 1, wherein the ejector comprises:
a first ejector surrounding the gas passage; and
a second ejector surrounding the first ejector.

6. The apparatus of claim 5, wherein the picker controller controls the picker to move up with an upper ejector of the first ejector and the second ejector while the picker is moved up in contact with the top of the die.

7. The apparatus of claim 6, wherein the ejector controller moves up the first ejector and the second ejector by the first height, and moves down the second ejector to a middle point of the first height with the first ejector fixed.

8. The apparatus of claim 6, wherein the ejector controller moves up the first ejector and the second ejector to a middle point of the first height, and moves up the first ejector with the second ejector fixed at the middle point.

9. The apparatus of claim 1, wherein the first height and the second height are set different from each other.

10. The apparatus of claim 1, wherein the second height is set smaller than the first height.

11. A method of transferring a die in bonding equipment, the method comprising:
positioning a die attached to a dicing tape over an ejector;
moving down a picker such that the picker contacts a top of the die;
moving up the picker which is in contact with the top of the die and the ejector and the picker by a first height at the same time; and
further moving up the picker by a second height with vacuum pressure applied downward from the ejector.

12. The method of claim 11, wherein the moving down of the picker includes applying vacuum pressure downward while the picker is moved down.

13. The method of claim 11, wherein the moving down of the picker includes applying pneumatic pressure upward with the picker moved up by the second height to be spaced apart from the ejector.

14. The method of claim 11, wherein the moving up of the ejector and the picker includes applying vacuum pressure downward while the ejector and the picker are moved up by the first height.

15. The method of claim 11, wherein the ejector comprises a first ejector surrounding a gas passage to which the vacuum pressure or pneumatic pressure is applied, and a second ejector surrounding the first ejector, and
the moving up of the ejector and the picker by the first height includes controlling the picker to move up with an upper ejector of the first ejector and the second ejector.

16. The method of claim 15, wherein the moving up of the ejector and the picker by the first height includes:
moving up the first ejector and the second ejector to a middle point of the first height; and
moving up the first ejector with the second ejector fixed at the middle point.

17. The method of claim 15, wherein the moving up of the ejector and the picker by the first height includes:
moving up the first ejector and the second ejector by the first height; and
moving down the second ejector to a middle point of the first height with the first ejector fixed.

18. A bonding equipment comprising:
a wafer stage configured to support a wafer including individual dies and to selectively separate the dies from the wafer;
a die transfer unit configured to transfer the dies from the wafer stage;
a die stage on which the dies transferred by the die transfer unit are seated and examined;
a bonding unit configured to pick up the dies from the die stage and to bond the dies on substrates, respectively; and
a bonding stage configured to support the substrates and to transmit substrates, which finished being bonded, to a magazine,
wherein the wafer stage comprises:
an ejector configured to push up the dies attached to a dicing tape;
an ejector controller configured to control moving-up or moving down of the ejector;
a gas passage disposed in the ejector and forming a gas channel for applying vacuum pressure or pneumatic pressure;
a gas stream controller configured to control the vacuum pressure or the pneumatic pressure through the gas passage; and
a tape suction unit disposed outside the ejector and configured to suction the dicing tape using vacuum pressure,
wherein the die transfer unit comprises:
a picker configured to suction and transfer the dies from above; and
a picker controller configured to control moving-up and moving down of the picker,
wherein the picker controller moves down the picker such that the picker contacts a top of a die,
wherein the gas stream controller is configured to control such that vacuum pressure is applied downward while the picker is moved down,
wherein the ejector controller moves up the ejector by a first height,
wherein the picker controller causes the vacuum pressure which is applied downward by the gas stream controller to move up the picker which is in contact with the top of the die by the first height,
wherein the ejector controller and the picker controller cause to move up the ejector and the picker by the first height at the same time,
wherein the picker controller further moves up the picker by a second height with the vacuum pressure applied downward by the gas stream controller, and
wherein the gas stream controller applies pneumatic pressure upward with the picker spaced apart from the ejector so that the picker suctions the die.

19. The bonding equipment of claim 18, wherein the ejector comprises:
a first ejector surrounding the gas passage; and
a second ejector surrounding the first ejector.

20. The bonding equipment of claim 19, wherein the ejector controller moves up the first ejector and the second ejector to a middle point of the first height, and moves up the first ejector with the second ejector fixed at the middle point.

* * * * *